United States Patent [19]

Ziegler et al.

[11] Patent Number: 4,858,153

[45] Date of Patent: Aug. 15, 1989

[54] METHOD AND APPARATUS FOR FIXING AN INSTANTANEOUS MEASURED VALUE

[75] Inventors: Herbert Ziegler; Carl W. Clever; Günter Roppelt, all of Nürnberg, Fed. Rep. of Germany

[73] Assignee: Brown, Boveri & Cie AG, Mannheim, Fed. Rep. of Germany

[21] Appl. No.: 34,783

[22] Filed: Apr. 3, 1987

[30] Foreign Application Priority Data

Apr. 8, 1986 [DE] Fed. Rep. of Germany ....... 3611772

[51] Int. Cl.$^4$ .................. G06F 15/20; G01R 15/08
[52] U.S. Cl. .................. 364/550; 324/99 D; 324/114; 324/115; 364/481
[58] Field of Search ............... 364/481, 483, 550, 575; 324/76 R, 990, 114, 115; 328/132; 340/722, 815.07

[56] References Cited

U.S. PATENT DOCUMENTS

| | | | |
|---|---|---|---|
| 4,077,061 | 2/1978 | Johnston et al. | 324/76 R |
| 4,158,809 | 6/1979 | Dellamano | 328/132 |
| 4,510,444 | 4/1985 | Haussel et al. | 324/99 D |
| 4,532,470 | 7/1985 | Wiesmann | 324/76 R |
| 4,748,404 | 5/1988 | Heinze et al. | 324/114 |

FOREIGN PATENT DOCUMENTS

| | | |
|---|---|---|
| 0348060 | 1/1979 | Austria . |
| 0156099 | 10/1985 | European Pat. Off. . |
| 2358796 | 5/1975 | Fed. Rep. of Germany . |
| 2605485 | 8/1977 | Fed. Rep. of Germany . |
| 2521191 | 6/1978 | Fed. Rep. of Germany . |
| 2849066 | 5/1980 | Fed. Rep. of Germany . |
| 3045033 | 7/1982 | Fed. Rep. of Germany . |
| 2806695 | 11/1983 | Fed. Rep. of Germany . |
| 2816302 | 11/1983 | Fed. Rep. of Germany . |
| 3408026 | 9/1985 | Fed. Rep. of Germany . |
| 0217036 | 1/1985 | German Democratic Rep. . |

OTHER PUBLICATIONS

German: Electronic Information, No. 3, 1986, pp. 38-42; "Mehrkanal—DMM/Datalogger Mod. 52—Aufbau, Bedienung und Einsatz".

Primary Examiner—Parshotam S. Lall
Assistant Examiner—Kevin J. Teska
Attorney, Agent, or Firm—Herbert L. Lerner; Laurence A. Greenberg

[57] ABSTRACT

A method and apparatus for fixing an instantaneous measured value performs the steps of creating measured values as a mean value of a set number of individual measurements, recording sequential measured values after initialization in a cycle determined by a flow control, checking with a control device if a new measured value exceeds a base value and if the difference between the two latest measured values lies within a given limit range, before fixing the respective new measured value, and checking with the control device if the difference between the individual values resulting from the latest two individual measurements lies within the given limit range and if a fixing of the last measured value and/or individual value takes place when the differences between the mean values and the differences between the individual values lie in the respective given limit range.

18 Claims, 3 Drawing Sheets

METHOD AND APPARATUS FOR FIXING AN INSTANTANEOUS MEASURED VALUE

The invention relates to a method and apparatus for fixing an instantaneous measured value, preferably on the display of a digital measuring instrument, in which sequential measured values are recorded in a cycle determined by a flow control after initialization, and in which a control device checks if a new measured value exceeds a base value and if the difference between the two latest measured values lies within a given limit range, before fixing the respective new measured value.

The measuring process can be considerably simplified in measuring methods carried out with the aid of computer modules. In order to perform measurements with customary measuring instruments it is still necessary to contact the measuring point and to read the measured value on the measuring instrument, while at the same time holding a probe in each hand. However, with easy-to-use modern measuring instruments a one-time, relatively short contact of the measuring point is sufficient. If the measuring circuit is interrupted, the measuring signal is automatically fixed, so that the measured value can be read with ease and without bodily contortions.

When fixing a changing measurement value, it is crucial to retain the measured value which best represents the electrical conditions within the measuring circuit.

A measuring instrument or meter is known from U.S. Pat. No. 4,532,470 which permits the automatic fixation of the measured value. The conditions under which a new instead of an old measured value is fixed, are determined with the aid of flow control. As a basic condition, it is determined that the newly measured value is greater than a relatively small base value. This assures that if a measuring point is not contacted, i.e. if a measured value missing, a possibly small interference value will not be recorded and displayed. As another condition, the difference between the old and the new measured values must fall within a narrow limit or threshold range. Thus a swiftly changing measured value should only be recorded after it has smoothed out. Finally, a new measured value should only be fixed when it can be assumed that the old measured value is no longer of interest. In the prior art device this condition is met when the measured value has sunk below the base value after the last fixing of a measured value, such as upon opening a measuring circuit, or if the measured value has been greatly changed.

The method of fixing an instantaneous measured value known from U.S. Pat. No. 4,532,470 is not satisfactory to the extent that the undesirable display of interferences can easily lead to a wrong interpretation of the measured results. Therefore, the decision concerning the validity of a measured value and its fixing is always made with the aid of individual values. If an interference coincides with a sensing cycle with which the flow control records new measured values, a momentary rise or fall of the measured value is fixed even though it does not show the real, representative measured value.

Furthermore, relatively short interference pulses can lead to the fixing of a new measured value while in reality the old measured value should have been retained.

It is accordingly an object of the invention to provide a method and apparatus for fixing an instantaneous measured value, which overcomes the hereinafore-mentioned disadvantages of the heretofore-known methods and devices of this general type and with which it is possible to make the fixing of the measured value free of interference to as great a degree as possible, so that the retained measured value represents the real state to the highest degree possible.

With the foregoing and other objects in view there is provided, in accordance with the invention, a method for fixing an instantaneous measured value, preferably on a display of a digital measuring instrument, which comprises creating measured values as a mean value of a set number of individual measurements, recording sequential measured values after initialization in a cycle determined by a flow control, checking with a control device or monitor if a new measured value exceeds a base value and if the difference between the two latest measured values lies within a given limit or threshold range, before fixing the respective new measured value, and checking with the control device if the difference between the individual values resulting from the latest two individual measurements lies within the given limit range and if a fixing of the last measured value and/or individual value takes place when the difference between the mean values and the differences between the individual values lie in the respective given limit range.

Since every measured value is created as a mean value from a set number of individual measurements, short intereferences cannot lead to a falsification of the measurement display. On the other hand, in order to also record the level of a relatively low-frequency superimposed component of change in spite of the elimination which is carried out by forming the mean value, the differences between the individual values as well as those of the mean values must also fall within a limit or threshold range before the measured value is fixed.

In accordance with another mode of the invention, there is provided a method which comprises maintaining the same given limit range for differences in the mean values and the individual values, and preferably setting the given limit range to 10 counts with 30,000 counts per measuring range.

In accordance with a further mode of the invention, there is provided a method which comprises fixing the base value at a lower threshold value in which normally there are no longer measurements taken in the respective measuring range, but which is larger than normal intereference signals, and preferably fixing the base value at 2,000 counts at 30,000 counts per measuring range, and forming the mean value at between eight and ten individual values.

Initialization of the flow required for the fixing of the measured value is of considerable importance. Therefore, in accordance with a further mode of the invention, there is provided a method which comprises initially initializing the flow by: depressing a flow key and then optionally depressing the flow key or by falling below the base value, and optionally initializing by opening a measuring circuit, setting a flag with the flow control after depression of the key as well as after falling below the base value, fixing a new measured value only with a flag set, and initially erasing the flag after fixing a new measured value.

In accordance with an added mode of the invention, there is provided a method which comprises acknowledging initialization by key depression with a first acknowledgement, preferably "Data" on a display, acknowledging fixing of the new measured value with a second acknowledgement, preferably "Hold" on a display, and additionally signalling acknowledgement with a beep.

In accordance with an additional mode of the invention, there is provided a method which comprises erasing the second acknowledgement display for marking the fixing of a measured value after a new flag has been set and the last measured value has exceeded the base value.

The display "Data" symbolizes in a functional manner the begin of a flow. The display "Hold" means that a new measured value is present.

With the objects of the invention in view, there is also provided a measuring apparatus for fixing an instantaneous measured value, comprising a measured value input unit for adapting a measured value, an input filter connected to the input unit, an A/D converter connected to the input filter, a flow control, preferably a microcomputer, connected to the A/D converter including means for fixing a base value and a limit or threshold range for differential value comparison, a keyboard having a flow key and being connected to the flow control, and a display connected to the flow control and having a numbers display and a quasi-analog display for displaying the measured values supplied to the display, and optionally an acoustical signal transmitter connected to the flow control.

In accordance with yet another feature of the invention, the flow control includes means for sequentially:
a) carrying out a first acknowledgement display, preferably "Data" upon depression of a key,
b) setting a flag,
c) continuously recording individual values and mean values,
d) comparing the mean values with a base value,
e) setting a flag upon receipt of a mean value below the base value,
f) checking to see that a flag has been set upon receipt of a mean value above the base value,
g) erasing a second acknowledgement display when a flag is set,
h) forming a difference of the latest respective mean values and checking if the difference is greater than a given limit range,
i) forming a difference of the latest respective individual values in case of smaller mean difference values and checking if the difference is larger than the given limit range,
j) displaying the mean value in the case of smaller mean difference values,
k) setting a second acknowledgement display, preferably "Hold",
l) erasing the flag,
m) testing for a renewed depression of the key in case of an erased flag, in case no flag is set, in case of difference values larger than the given limit range, and after setting a flag because of a measured value which is smaller than the base value,
n) repeating the functions set forth in c) through m) above with the renewed recording of individual and mean values if the key has not been depressed, and
o) erasing the second acknowledgement display and then terminating the procedure after the key has been depressed again.

The functions provided by the means recited in items a, g, k and n above, can be omitted.

In accordance with a concomitant feature of the invention, there are provided means for fixing only the numbers display and the associated range display, but not the quasi-analog measuring display.

Other features which are considered as characteristic for the invention are set forth in the appended claims.

Although the invention is illustrated and described herein as embodied in a method and apparatus for fixing an instantaneous measured value, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
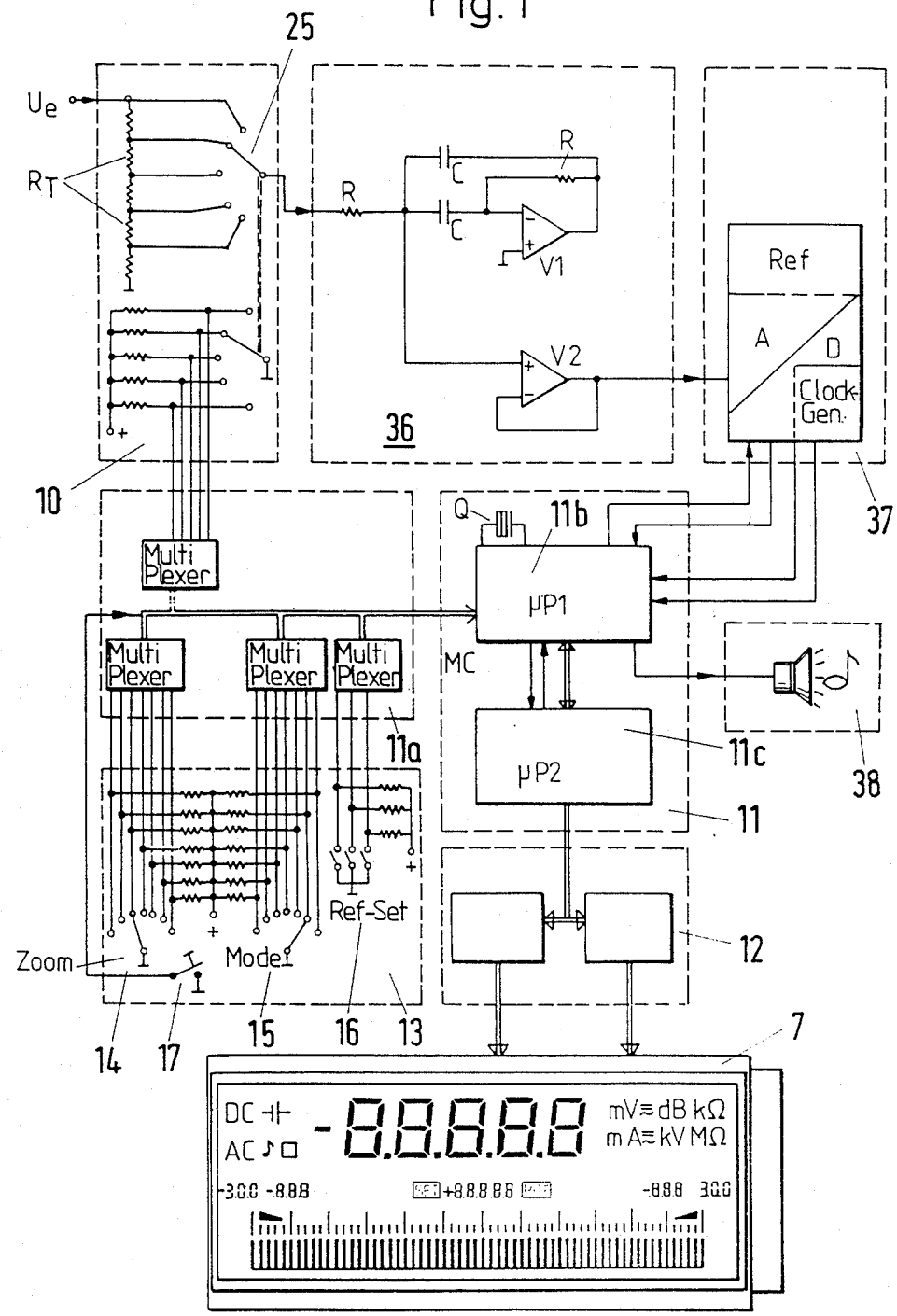
FIG. 1 is a schematic and block circuit diagram of a measuring instrument in which the method according to the invention is used.

Referring now to the figures of the drawings in detail and first, particularly, to FIG. 1 thereof, it is seen that the measuring instrument or meter shown in FIG. 1 in the form of a block circuit diagram has a display 7 which permits a numbers display as well as a quasi-analog display to be made. In order to replicate a certain indicator position among a plurality of indicator segments along a graduated measuring scale in the quasi-analog display, the indicator segment having a position which corresponds to the measured value to be displayed, is selected. A special advantage of this measuring instrument is that a widely spread sector of the measuring range can be selected from the preset total measuring range. This permits the use of a very high resolution corresponding to a conventional measuring scale of several measuring instruments.

The block circuit diagram contains a measured value input unit 10 and a measuring range switch 25, which adapts an input signal $U_e$ and supplies it to an active filter 36, with the aid of voltage dividers RT. The filter 36 is a second order low-pass filter and its task is to simulate the dynamic behavior of a rotating coil measuring system. Downstream of the filter 36, the measured signal is converted in a 16-bit A/D converter 37, which is capable of converting at least 20 measurements per second. A reference voltage source is already integrated into the A/D converter, as is a clock generator, which emits a clock and status signal in accordance with the conversion rates to a microcomputer 11 downstream thereof.

The microcomputer 11 in the illustrated embodiment includes a port expansion 11a, a first microprocessor 11b and a second microprocessor 11c. The microcomputer 11 controls the entire course of measurement of the digital measuring instrument with a suitable program. On one hand, the first microprocessor 11b corresponds with the A/D converter 37 and on the other hand, it corresponds through the port expansion 11a with the measurement input unit 10 and a keyboard 13. If valid measured values are present at the A/D converter, then the first microprocessor 11b, which is clock-stabilized by a quartz crystal Q, issues a command to serially read-in the data of the measured value through a start/convert line. The switch word is also taken over into the first microprocessor through the port expansion 11a. The prepared switch word includes 6 bytes and detects the positions of the measuring range switch 25 of the measurement input unit 10, a zoom switch 14, a mode switch 15 and a reference set (ref-set) switch 16. The switch word, a two-byte measurement word and the two-byte control data are transferred to the second microprocessor 11c as soon as the second microprocessor is ready to receive data.

The port expansion 11a makes it possible to reduce the numerous switch positions that are to be taken into account in the switch word to a few inputs of the first microprocessor 11b, with the aid of multiplexers. The scale extension is determined with the zoom switch 14; the mode switch 15 permits the automatic scale selection to be switched on, with a scale switchover taking place after delay periods of 1, 2 or 5 seconds; and the reference set switch 16 permits a reference value to be set. The fixation of a measured value as a numerical display can be initialized by a flow or data-hold key 17.

An acoustical signal transducer 38 which is also connected to the first microprocessor 11b, enables an acoustical signal to be emitted, such as when a reference value is attained or exceeded, or fails to be attained, or when the measurement value has been fixed. It is also possible to signal movement toward or away from the reference value by varying the signal frequency.

The essential work performed in displaying the measured value on the display 7 is performed by the second microprocessor 11c, which is connected to the display through a display driver 12. On one hand, the second microprocessor 11c is connected to the first microprocessor 11b through a data bus and control lines and passes its instructions to LCD drivers, which in turn act directly on the segments of the LCD in accordance with the program predetermined for it.

Figure 2:
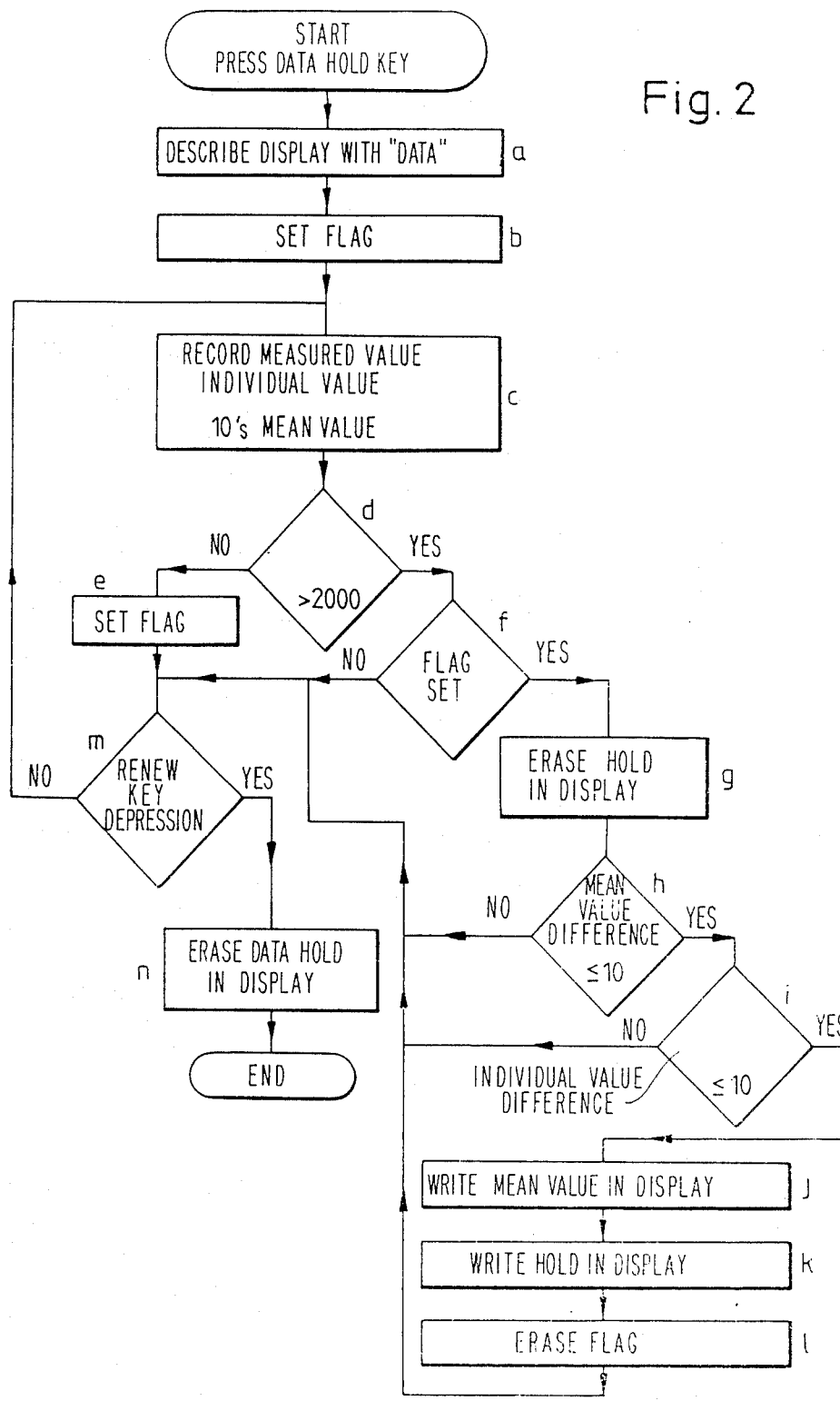
FIG. 2 is a flow chart containing the conditions required for fixing a measured value.

The flow chart shown in FIG. 2 reveals the steps through which the flow control, which is mainly represented by the microcomputer 11, accomplishes the fixing of a new measured value. After actuating the flow key 17, which can also be called a "data-hold key", a display "Data" is activated in the display 7. This operation is described by a block a. As shown by block b, a flag is also set and must basically be present before a new measured value can be fixed. According to block c, a measured value recordation takes place wherein individual values and mean values respectively formed of 10 individual values are sequentially fed in and checked. A check operation contained in block d determines if the respective new mean value is larger than 2,000 counts. If this is the case, block f checks if a flag has been set. If this is also the case, "hold information" which indicates the fixing of a measured value and which is possibly still being held in the display, is erased in block g. This sets the basic conditions for fixing the new measured value as long as it also fulfills the conditions according to block h and block i. Block h requires that the difference between the two latest mean values is smaller than 10 counts and according to block i the difference between the two latest individual values also may not exceed this limit. If the conditions are met, the new mean value is written in the display according to block j. As required, the new individual value can, of course, also be written in the display. Furthermore, the new mean value is acknowledged by a display "Hold" with block k. After this event the flag is erased on block 1.

A check of the flow control according to block m to determine if the key has been depressed again, is triggered if the flag is erased, or if there is too large a difference value established by a comparison of the mean values or of the individual values, or if a flag has not been set, or if a flag is set in block e after the mean value has less than 2,000 counts. If this is the case, the "Data-Hold" on the display 7 is erased in block n. If the flow key 17 has not been depressed, the flow is restarted with the measured value recordation in block c.

It is important for the quasi-analog display to continue to work independently after fixing the numbers display, so that possible changes of the measured value can be immediately recognized with a fixedly connected measuring signal source. An opening of the measuring circuit after depression of the flow key 17 results in a reduction of the mean value to below 2,000 during the check according to block d and therefore a flag is set according to block e. If the measuring circuit is closed again, it can be assumed that a new measured value is to be recorded. Therefore, if the mean value according to block d lies above 2,000 counts, the result is a decision in block f that a flag was set. Therefore, only the conditions of blocks h and i must be met in order to fix a new measured value.

Figure 3:
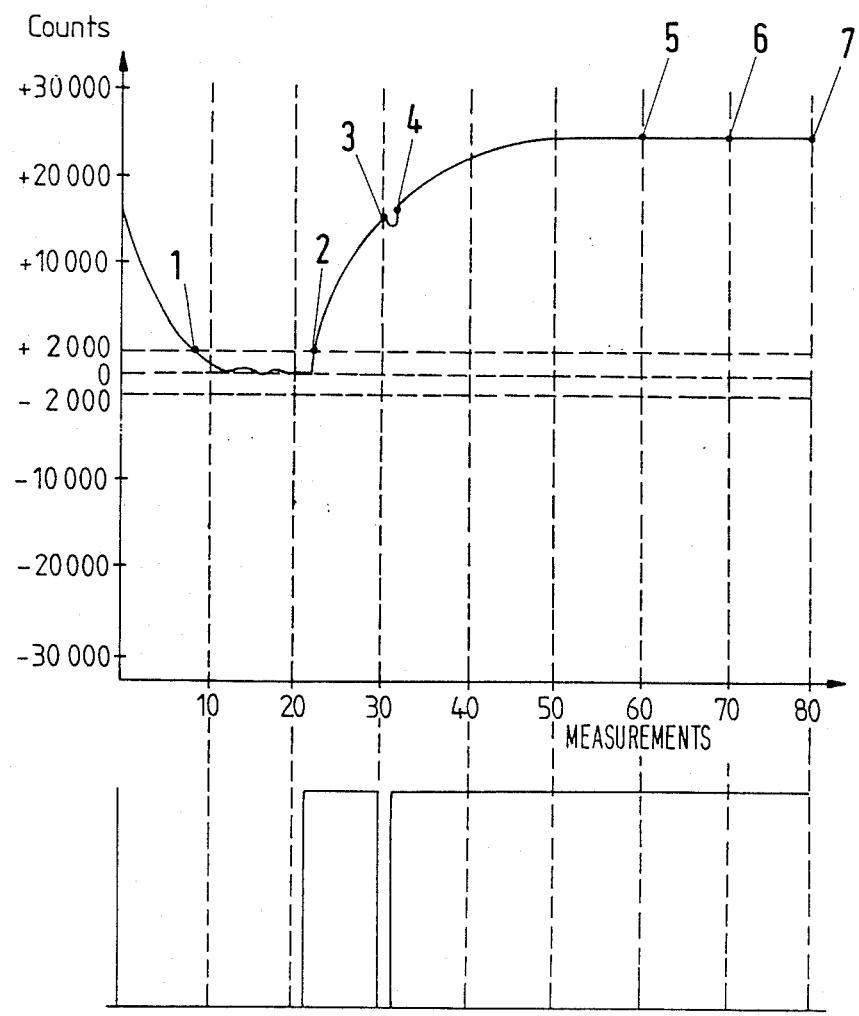
FIG. 3 is a graph showing the fixing of the measured value while the measured value changes.

The conditions with a changing signal are shown in FIG. 3. The measuring range includes ±30,000 counts, i.e. it ranges from =30,000 to +30,000. The base value for a decision according to block d is ±2,000 counts. A mean value is formed of ten individual measurements. The graph includes a total of 80 individual measurements. If the flow of the curve is considered, measurements can, of course, be taken between points 1 and 2, but the resulting measured values are not fixed since they are smaller than the base value of 2,000 counts.

A rectangular impulse applied at the input of the measuring instrument is strongly damped by the filter 36, so that the measuring signal follows the course of an e-function at the input thereof. A short interruption of the input signal, which is unimportant by itself, would simulate a very small differential value at points 3 and 4 of the signal during the evaluation of the individual measurements. However, because of the formation of the mean value, this short interruption is of no importance. Up to point 5 the change of the measuring signal applied to the A/D converter 37 is in any case of such size that a difference between the latest two mean values is larger than the permissible limit of 10 counts. Up to this point there can be no fixing of the measured value. The transient stage is only reached beginning from point 5, so that finally the difference between the mean value extending from point 5 to point 6 and between the mean value extending from point 6 to point 7 fulfills the condition and remains under 10 counts. The individual values also remain smaller than 10 counts. A fixing of the mean value therefore takes place between points 6 and 7.

The foregoing is a description corresponding in substance to German Application No. P 36 11 772.2, dated Apr. 8, 1986, the International priority of which is being claimed for the instant application, and which is hereby made part of this application. Any material discrepancies between the foregoing specification and the aforementioned corresponding German application are to be resolved in favor of the latter.

We claim:

1. Method for fixing an instantaneous measured value, which comprises creating measured values as mean values of a set of individual measured values, recording sequentially the individual measured values after initialization in a cycle determined by a flow control, checking in a first test with a control device that a new individual measured value exceeds a given base value, and that a difference between two latest individual measured values lies within a given limit range; before fixing a respective new measured value, checking with the control device that the difference between the two latest individual measured values resulting from the latest two individual measurements lies within the given limit range and fixing the last individual measured value when the differences between the mean values and the differences between the individual measured values lie in the respective given limit range.

2. Method according to claim 1, which comprises displaying the fixed measured value on a display of a digital measuring instrument.

3. Method according to claim 1, which comprises maintaining the same given limit range for all differences in the mean measured values and the individual values.

4. Method according to claim 3, which comprises setting the given limit range to 10 counts with 30,000 counts per measuring range.

5. Method according to claim 1, which comprises fixing the base value at a lower value in which there are no longer measurements taken in the respective measuring range, and which is larger than normal interference signals.

6. Method according to claim 5, which comprises fixing the base value at 2,000 counts at 30,000 counts per measuring range, and forming the mean value with between eight and ten individual measured values.

7. Method according to claim 1, which comprises initializing the flow control by: depressing a flow key and then in response to one of the steps: observing that the individual measured values fall below the base value, and by opening a measuring circuit, setting a flag in the flow control, fixing a new measured value only with a flag set, and erasing the flag after fixing a new measured value.

8. Method according to claim 7, which comprises acknowledging initialization by key depression by indicating "Data" on a display, acknowledging fixing of a new measured value by indicating "Hold" on the display, and additionally signalling each acknowledgement with a beep.

9. Method according to claim 7, which comprises acknowledging initialization by key depression with a first acknowledgement on a display, acknowledging fixing of a new measured value with a second acknowledgement on a display, and additionally signalling each acknowledgement with a beep.

10. Method according to claim 9, which comprises erasing the second acknowledgement display for indicating the fixing of a measured value after a new flag has been set and the last measured value has exceeded the base value.

11. Measuring apparatus for fixing an instantaneous measured value, comprising a measured value input unit for receiving a measured value, an input filter connected to said input unit, an A/D converter connected to said input filter, a flow control connected to said A/D converter having means for fixing a base value and a limit range for difference value comparison, means for forming measured values as mean values from sets of individual measured values, and means for forming differences between individual measured values and between mean values, a keyboard, having a hold key, being connected to said flow control, and a display connected to said flow control having a numbers display and a quasi-analog display for displaying the measured values supplied to said display.

12. Measuring apparatus according to claim 11, wherein said flow control is a microcomputer.

13. Measuring apparatus according to claim 11, including an acoustical signal transmitter connected to said flow control.

14. Measuring apparatus according to claim 11, wherein said flow control includes means for sequentially:
 a) setting a flag,
 b) continuously recording individual values and mean values,
 c) comparing the mean values with a base value,
 d) setting a flag upon receipt of a mean value below the base value,
 e) checking to see that a flag has been set upon receipt of a mean value above the base value,
 f) forming a difference of the latest respective mean values and checking that the difference is greater than a given limit range,
 g) forming a difference of the latest respective individual values in case of smaller mean difference values and checking that the difference is larger than the given limit range,
 h) displaying the mean value in the case of smaller mean difference values,
 i) erasing the flag,
 j) testing for a renewed depression of the key in case of an erased flag, in case no flag is set, in case of difference values larger than the given limit range, and after setting a flag because of a measured value which is smaller than the base value, and
 k) erasing the second acknowledgement display and then terminating the procedure after the key has been depressed again.

15. Measuring apparatus according to claim 11, wherein said flow control includes means for sequentially:
 a) carrying out a first acknowledgement display, upon depression of a key,
 b) setting a flag,
 c) continuously recording individual values and mean values,
 d) comparing the mean values with a base value,
 e) setting a flag upon receipt of a mean value below the base value,
 f) checking to see that a flag has been set upon receipt of a mean value above the base value,
 g) erasing a second acknowledgement display when a flag is set,
 h) forming a difference between the latest mean values and checking that the difference is greater than a given limit range,
 i) forming a difference between the latest individual values in case the mean difference values are smaller than the differences between the latest individual values, and checking that the difference is larger than the given limit range,
 j) displaying the mean value in the case of smaller mean difference values,
 k) setting a second acknowledgement display, l) erasing the flag, m) testing for a renewed depression of the key in case of an erased flag, in case no flag is set, in case of difference values larger than the given limit range, and after setting a flag because of a measured value which is smaller than the base value, n) repeating the functions set forth in c) and m) above with the renewed recording of individual and mean values if the key has not been depressed, and o) erasing the second acknowledgement display and then terminating the procedure after the key has been depressed again.

16. Measuring apparatus according to claim 15, including means for fixing only the numbers display and an associated range display.

17. Measuring apparatus according to claim 15, wherein the first acknowledgement display is carried out by displaying "Data", and the second acknowledgement display is set by displaying "Hold".

18. Measuring apparatus according to claim 17, including means for fixing only the numbers display and an associated range display.

* * * * *